(12) United States Patent
Otremba et al.

(10) Patent No.: US 9,627,292 B2
(45) Date of Patent: Apr. 18, 2017

(54) SEMICONDUCTOR HOUSING WITH REAR-SIDE STRUCTURING

(71) Applicant: Infineon Technologies AG, Neubiberg (DE)

(72) Inventors: Ralf Otremba, Kaufbeuren (DE); Josef Hoeglauer, Heimstetten (DE); Xaver Schloegel, Sachsenkam (DE); Juergen Schredl, Mering (DE)

(73) Assignee: Infineon Technologies AG, Neubiberg (DE)

( * ) Notice: Subject to any disclaimer, the term of this patent is extended or adjusted under 35 U.S.C. 154(b) by 17 days.

(21) Appl. No.: 14/036,110

(22) Filed: Sep. 25, 2013

(65) Prior Publication Data

US 2014/0084449 A1  Mar. 27, 2014

(30) Foreign Application Priority Data

Sep. 25, 2012  (DE) ........................ 10 2012 018 943

(51) Int. Cl.
*H01L 23/40* (2006.01)
*H01L 21/50* (2006.01)
*H01L 23/495* (2006.01)

(52) U.S. Cl.
CPC .......... *H01L 23/4006* (2013.01); *H01L 21/50* (2013.01); *H01L 23/49562* (2013.01); *H01L 2924/0002* (2013.01)

(58) Field of Classification Search
CPC . H01L 23/42; H01L 23/3737; H01L 23/3178; H01L 23/28

USPC .... 257/E23.18, 687, 690, 719; 438/122, 118
See application file for complete search history.

(56) References Cited

U.S. PATENT DOCUMENTS

| 5,046,141 | A | | 9/1991 | Walker |
| 5,587,882 | A | * | 12/1996 | Patel ................... H01L 23/3675 257/713 |
| 5,926,371 | A | * | 7/1999 | Dolbear ........................ 361/704 |
| 6,936,919 | B2 | * | 8/2005 | Chuang et al. ............... 257/717 |
| 8,455,987 | B1 | * | 6/2013 | Spann ..................... H01L 21/56 257/675 |
| 8,519,525 | B2 | * | 8/2013 | Xue .................. H01L 23/49524 257/666 |
| 2001/0018235 | A1 | * | 8/2001 | Choi ................... H01L 23/3121 438/122 |
| 2008/0296757 | A1 | | 12/2008 | Hoffman et al. |
| 2009/0103270 | A1 | * | 4/2009 | Desrosiers et al. ........... 361/719 |
| 2009/0261472 | A1 | * | 10/2009 | Bayerer ....................... 257/719 |
| 2011/0228482 | A1 | | 9/2011 | Schmidt et al. |
| 2012/0299150 | A1 | * | 11/2012 | Tang ...................... H01L 23/36 257/531 |

* cited by examiner

*Primary Examiner* — Matthew Landau
*Assistant Examiner* — Krista Soderholm
(74) *Attorney, Agent, or Firm* — Slater Matsil, LLP

(57) ABSTRACT

A semiconductor housing includes a fixing mechanism and at least one side having structurings. A method for producing a semiconductor device is provided in which a thermally conductive paste is applied on the at least one side of the semiconductor housing and/or of a heat sink. The semiconductor housing is fixed to the heat sink by means of the fixing mechanism. A pressure is exerted on the thermally conductive paste by means of the fixing mechanism and the thermally conductive paste is diverted by means of diversion channels depending on the pressure exerted.

22 Claims, 2 Drawing Sheets

SEMICONDUCTOR HOUSING WITH REAR-SIDE STRUCTURING

This application claims priority to German Patent Application 10 2012 018 943.5, which was filed Sep. 25, 2012 and is incorporated herein by reference.

TECHNICAL FIELD

The present invention relates to a semiconductor housing with rear-side structuring.

BACKGROUND

In many areas of electronics, sensor technology and microsystems engineering, the production requirements give rise to a constraint for increasing miniaturization and for increasing productivity by joining together subsystems in more highly integrated structures. The trend toward ever more highly integrated and more compact designs leads, for structural reasons, to the individual components being heated ever increasingly per unit area on account of the ever increasing performance and the power thus generally consumed. In order to ensure an effective dissipation of heat from the components particularly in the semiconductor power field, components are linked to heat sinks, for example. The dissipation of heat is determined here by the contact and thus the thermal resistance Rth between the component and the heat sink. In this case, the contact areas of the components and of the heat sink can be contacted directly or by means of a thermal paste. This leads to varying dissipation of heat.

SUMMARY OF THE INVENTION

The invention is generally concerned with the dissipation of heat from semiconductor housings by optimizing the heat sink linking to the semiconductor housing.

In one embodiment, the semiconductor housing comprises a fixing mechanism (or fixing means) and at least one side having structurings. This embodiment is particularly suitable in the case of power semiconductor housings, since the latter have to be connected to heat sinks in a particularly suitable manner for the purpose of dissipating heat.

In a further embodiment of the semiconductor housing, the at least one side of the semiconductor housing can have structurings in the region of a molding compound and/or of a leadframe and/or of an insulation layer. By virtue of the fact that the semiconductor housing has structurings in different regions, the thermal conductivity can be adjusted particularly efficiently depending on the regions chosen.

In one embodiment of the semiconductor housing, the structuring of the at least one side can be embodied in such a way that applied thermally conductive paste is distributed within the structuring. By the application of a thermally conductive paste to the structurings of the at least one side and the linking of the semiconductor housing to a heat sink, for example, the thermal conductivity and thus the dissipation of heat from the semiconductor housing can be adjusted particularly advantageously.

In one embodiment of the semiconductor housing, the structuring of the at least one side of the semiconductor housing can be embodied in such a way that it forms diversion channels. For example thermally conductive material, preferably pastes or adhesives, can be better distributed and diverted by means of the diversion channels.

In one embodiment of the semiconductor housing, at least parts of the structuring of the at least one side of the semiconductor housing can be embodied in such a way that quantities of the thermally conductive paste applied to the semiconductor housing or to the heat sink can be diverted from the rear side of the semiconductor housing by means of the structuring. Thermally conductive paste applied to the structurings of the semiconductor housing in excessive amounts can be diverted in a simple manner by way of the structurings.

In one embodiment of the semiconductor housing, the thermal conductivity of the semiconductor housing can be adjustable by way of the fixing mechanism and the applied thermally conductive paste and the structuring. This affords the major advantage that, depending on the strength of the fixing of the semiconductor housing to a heat sink, for example, the dissipation of heat from the semiconductor housing is adjustable by means of the fixing mechanism.

In a further embodiment of the semiconductor housing, the fixing mechanism can have a hole in the semiconductor housing and a screw or clamp. With screws and/or a clamping mechanism, semiconductor housings having a hole, for example, can be fixed preferably to a heat sink in a cost-effective manner.

In one embodiment of the semiconductor housing, the layer thickness of the thermally conductive paste can be adjustable by means of a pressure generated by the fixing mechanism on the thermally conductive paste and by means of the structuring of the semiconductor housing and furthermore the dissipation of the heat from the semiconductor housing to the heat sink can be adjustable by means of the layer thickness of the thermally conductive paste. This embodiment affords the advantage that thin layer thicknesses of a thermally conductive paste are realizable and adjustable which ensure that an efficient heat transfer from the semiconductor housing to the heat sink takes place and moreover is also adjustable.

In one embodiment, a method for fixing a semiconductor housing includes applying a thermally conductive paste on the at least one side of the semiconductor housing and/or of a heat sink. The semiconductor housing is fixed, preferably to the heat sink, by means of a fixing mechanism. A pressure is exerted on the thermally conductive paste by means of the fixing mechanism, and the thermally conductive paste is diverted by diversion channels depending on the pressure exerted.

Exemplary embodiments of the invention are explained in greater detail below, with reference to the accompanying figures. However, the invention is not restricted to the embodiments specifically described, but rather can be suitably modified and altered. It lies within the scope of the invention to suitably combine individual features and feature combinations of one embodiment with features and feature combinations of another embodiment in order to arrive at further embodiments according to the invention.

Before the exemplary embodiments of the present invention are explained in greater detail below with reference to the figures, it is pointed out that identical elements in the figures are provided with the same or similar reference signs and that a repeated description of these elements is omitted. Furthermore, the figures are not necessarily true to scale. Rather, the main emphasis is on elucidating the basic principle.

DETAILED DESCRIPTION OF ILLUSTRATIVE EMBODIMENTS

Figure 1:
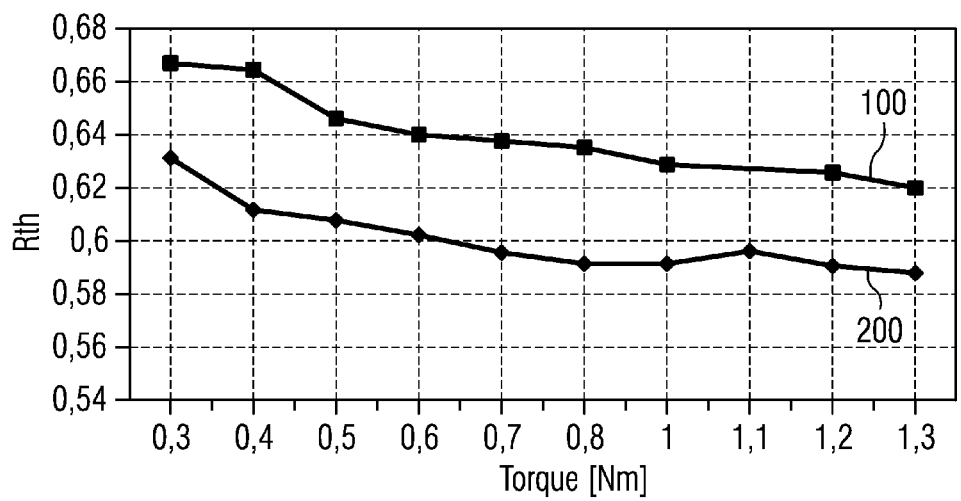
FIG. 1 shows a diagram illustrating the resistance Rth of the thermal conductivity of two thermally conductive pastes as a function of the torque exerted on the screw.

FIG. 1 shows a diagram illustrating the thermal resistance Rth of two thermally conductive pastes and semiconductor housings 100, 200 as a function of the torque exerted by means of a screw. By means of an increase in torque [Nm] in both cases the layer thicknesses of a thermally conductive paste can be reduced, which in turn leads to a reduction of the thermal resistance of the thermally conductive paste and thus to a better dissipation of the heat from the semiconductor component to the heat sink. Owing to the possibility of adjusting the layer thicknesses of the thermally conductive layer by means of the torque, the layer thicknesses and thus the heat dissipation can therefore likewise be adjusted very well.

Figure 2A:
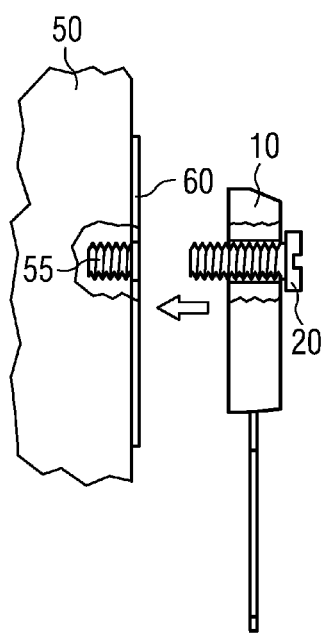
FIG. 2a schematically shows a semiconductor housing with a fixing mechanism, a paste and a heat sink.

FIG. 2a shows a semiconductor housing 10 with a fixing mechanism (or device or apparatus or other means) 20. The fixing mechanism can be a screw, as shown here, or some other suitable fixing mechanism that fulfills the same function as a screw. FIG. 2a furthermore shows a heat sink 50 with a paste 60. The paste 60 is preferably a thermally conductive paste in this exemplary application. The heat sink 50 likewise has a hole 55 having a screw thread for receiving the screw 20. The hole 55 is therefore embodied in such a way that it is suitable for entering into a fixed adjustable connection with the fixing mechanism 20.

Figure 2B:
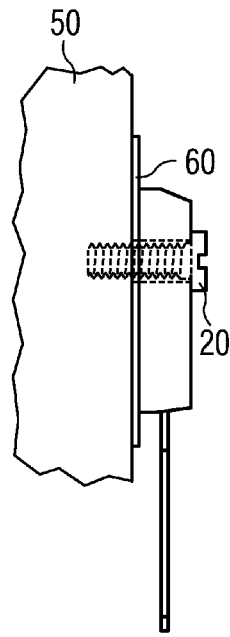
FIG. 2b schematically shows a semiconductor housing in side view which is fixed to a heat sink by means of a fixing mechanism and a paste.

FIG. 2b shows a semiconductor housing 10 with a fixing mechanism 20. By way of the fixing mechanism 20, a screw in this exemplary embodiment, the semiconductor housing 10 is fixed to a heat sink 50. A thermally conductive paste 60 is arranged between the heat sink 50 and the semiconductor housing 10. The layer thickness of the thermally conductive paste 60 is adjustable by using the screw 20, in particular by the adjusted torque of the screw and the pressure thereby exerted on the thermally conductive paste 60. However, the layer thickness of the thermally conductive paste is inversely proportional to the thermal dissipation of heat from the semiconductor housing 10. In other words, the thinner the layer of the thermally conductive paste 60, the greater the extent to which the heat can be dissipated from the semiconductor housing to the heat sink 50. The degree of heat dissipation is therefore adjustable by way of the adjusted torque on the screw 20 and the resultant layer thickness of the thermally conductive paste 60.

Figure 2C:
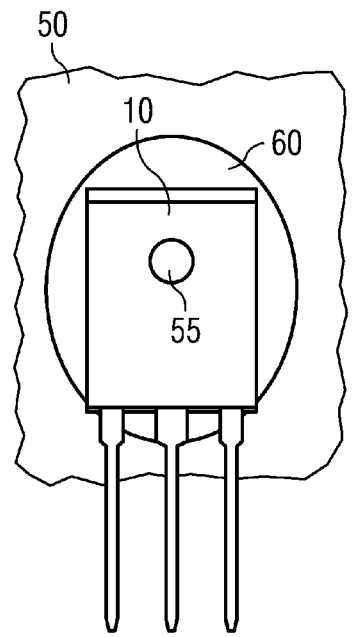
FIG. 2c schematically shows a semiconductor housing with a hole in plan view which is fixed to a heat sink by means of a paste.

FIG. 2c essentially shows FIG. 2b in plan view. The plan view reveals a hole in the semiconductor and in the heat sink 55 in plan view.

Figure 3A:
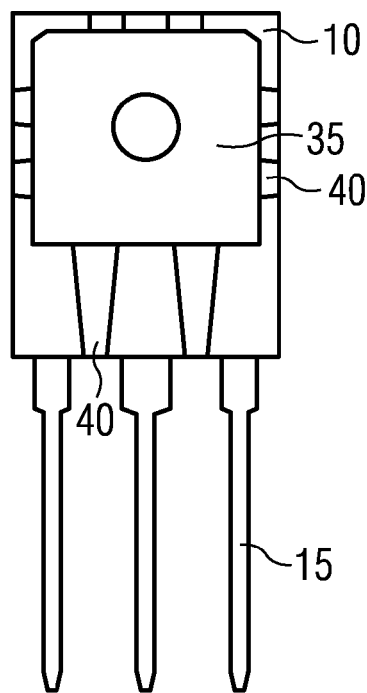
FIG. 3a shows the rear side of a semiconductor housing with structurings and trenches.

FIG. 3a shows a semiconductor housing 10 in a view from the rear side. The semiconductor housing comprises contacts 15 for electrical contact-making. Furthermore, the semiconductor housing has a metallization 35. The metallization, as the name already suggests, is generally composed of metal and is therefore embodied for better dissipation of heat from the interior of the semiconductor housing 10. Furthermore, the semiconductor housing comprises structurings 40. By means of the structurings 40, for example, thermally conductive paste can be better distributed on the rear side and excess paste can be diverted toward the outside (in the direction of the arrow). The structurings 40 can be embodied as trenches and the trenches can extend only partly or over the entire rear side, that is to say also over the area of the cooling plate 35, of the semiconductor housing.

Figure 3B:
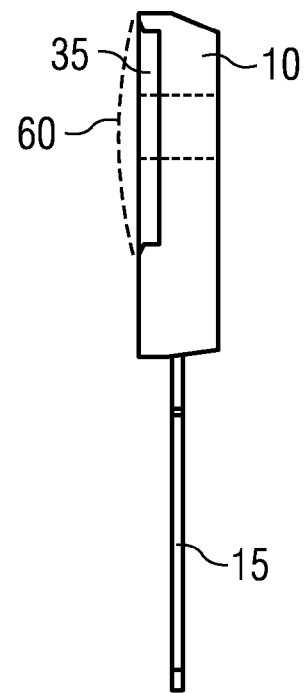
FIG. 3b shows a semiconductor housing like that in FIG. 3a in side view with a paste 60.

FIG. 3b shows FIG. 3a in side view with semiconductor housing 10, electrical contacts 15, metallization 35 and a thermally conductive paste 60. The functioning is identical to that in the figures described above.

What is claimed is:

1. A packaged semiconductor device comprising:
   a housing configured to receive an external fastener for affixing the packaged semiconductor device to an external heat sink;
   a plurality of leads extending from one side of the housing;
   a plurality of trenches extending into a housing material at a side of an exterior surface of the housing; and
   a semiconductor device packaged inside the housing, wherein the exterior surface of the housing comprises a metallization layer of the semiconductor device, wherein the plurality of trenches is adapted to distribute a
   thermally conductive paste when the housing is affixed to the external heat sink,
   wherein the semiconductor device is not disposed between the exterior surface of the housing and the external heat sink, wherein a first trench of the plurality of trenches is disposed between the plurality of leads and the metallization layer of the semiconductor device.

2. The packaged semiconductor device as claimed in claim 1, wherein the trenches are further disposed in a region of a molding compound, a lead frame or an insulation layer.

3. The packaged semiconductor device as claimed in claim 1, wherein the trenches comprise diversion channels.

4. The packaged semiconductor device as claimed in claim 1, wherein
   the housing further comprises a hole for receiving an external screw, and
   dissipation of heat from the housing to a heat sink is adjustable by adjusting a torque applied to the external screw.

5. The packaged semiconductor device as claimed in claim 3, wherein the diversion channels are configured to divert quantities of an applied thermally conductive paste from a rear exterior side of the housing by way of the diversion channels.

6. The packaged semiconductor device as claimed in claim 5, wherein
   a layer thickness of the thermally conductive paste is adjustable by a pressure generated by the external fastener on the thermally conductive paste and by the diversion channels, and
   dissipation of heat from the housing to a heat sink is adjustable by adjusting the layer thickness of the thermally conductive paste.

7. A thermal conduction apparatus comprising:
   a heat sink;
   a packaged semiconductor device;
   wherein the packaged semiconductor device comprises a housing, a plurality of leads extending from the housing along a first direction, and a semiconductor device packaged inside the housing, the semiconductor device comprising a metallization layer having an exposed surface, wherein the semiconductor device is not disposed between an exterior surface of the housing and the heat sink;

a plurality of trenches extending into the housing, wherein the plurality of trenches are comprised in the exterior surface of the housing of the packaged semiconductor device, wherein first trenches of the plurality of trenches oriented along the first direction and disposed between the metallization layer and the plurality of leads; and a thermally conductive adhesive adhering the packaged semiconductor device to the heat sink, the thermally conductive adhesive being disposed on surfaces of the packaged semiconductor device and the heat sink and in the plurality of trenches between the packaged semiconductor device and the heat sink, wherein the thermally conductive adhesive directly contacts the heat sink.

8. The thermal conduction apparatus as claimed in claim 7, further comprising a fastener joining the packaged semiconductor device with the heat sink.

9. The thermal conduction apparatus as claimed in claim 7, further comprising a screw connecting the packaged semiconductor device to the heat sink, wherein dissipation of heat from the housing of the packaged semiconductor device to the heat sink is adjustable by adjusting a torque applied to the screw.

10. The thermal conduction apparatus as claimed in claim 7, further comprising a clamp connecting the packaged semiconductor device to the heat sink.

11. The thermal conduction apparatus as claimed in claim 7, wherein the thermally conductive adhesive comprises a thermally conductive paste.

12. A method for affixing a heat sink, the method comprising:

providing a housing of a packaged semiconductor device that includes:
a semiconductor device packaged inside the housing, wherein the semiconductor device is not disposed between an exterior surface of the housing and the heat sink,
a plurality of trenches on a side of an exterior surface of the housing, and
a fastener;

applying a thermally conductive paste on at least one of the side of the housing and the heat sink;

affixing the housing to the heat sink by using the fastener; and exerting pressure on the thermally conductive paste using the fastener, wherein the exerting comprises:
redistributing the thermally conductive paste using the plurality of trenches, and
diverting excess of the thermally conductive paste in a direction away from the semiconductor device through the plurality of trenches, wherein the thermally conductive paste directly contacts the heat sink after the exerting of the pressure.

13. The method as claimed in claim 12, wherein the trenches are located in a region of a molding compound, a lead frame or an insulation layer.

14. The method as claimed in claim 12, wherein
the housing comprises a hole,
the fastener comprises a screw, and
the method further comprises adjusting dissipation of heat from the housing to the heat sink by adjusting a torque applied to the screw.

15. The method as claimed in claim 12, wherein the fastener comprises a clamp.

16. The method as claimed in claim 12, wherein exerting pressure and diverting the thermally conductive paste comprises generating an amount of pressure based upon a desired layer thickness of the thermally conductive paste.

17. The method as claimed in claim 16, wherein dissipation of heat from the housing to the heat sink is adjustable by adjusting the layer thickness of the thermally conductive paste.

18. The packaged semiconductor device as claimed in claim 1, wherein
the housing further comprises a cooling plate disposed at a middle of the housing exterior surface,
the external heat sink is separate from the cooling plate, and
the trenches do not extend over the cooling plate.

19. The method as claimed in claim 12, wherein
the housing further comprises a cooling plate at a middle of the housing exterior surface,
the heat sink is separate from the cooling plate, and
the trenches do not extend between the heat sink and the cooling plate.

20. The semiconductor device of claim 7, wherein the thermally conductive adhesive is further disposed in:
a first trench located in a first housing region having a first thermal conductivity, and
a second trench located in a second housing region having a second thermal conductivity that is different than the first thermal conductivity.

21. The thermal conduction apparatus as claimed in claim 7, wherein the thermally conductive adhesive is distributed across the exterior surface using the plurality of trenches, wherein the plurality of trenches are configured to divert excess thermally conductive adhesive away from the metallization layer.

22. The thermal conduction apparatus as claimed in claim 7, further comprising:
second trenches of the plurality of trenches oriented along a second direction perpendicular to the first direction.

* * * * *